US012761290B2

(12) United States Patent
Sasaki et al.

(10) Patent No.: US 12,761,290 B2
(45) Date of Patent: Oct. 13, 2026

(54) ELECTRONIC COMPONENT TRANSFER SYSTEM

(71) Applicant: TOKYO WELD CO., LTD., Tokyo-to (JP)

(72) Inventors: Shunsuke Sasaki, Tokyo-to (JP); Hiroki Ohnishi, Tokyo-to (JP); Taiyo Komori, Tokyo-to (JP); Rintaro Takagi, Tokyo-to (JP); Haruka Tooyama, Tokyo-to (JP); Yoshikazu Sasaoka, Tokyo-to (JP)

(73) Assignee: TOKYO WELD CO., LTD., Tokyo-to (JP)

( * ) Notice: Subject to any disclaimer, the term of this patent is extended or adjusted under 35 U.S.C. 154(b) by 174 days.

(21) Appl. No.: 18/940,150

(22) Filed: Nov. 7, 2024

(65) Prior Publication Data

US 2025/0147124 A1 May 8, 2025

(30) Foreign Application Priority Data

Nov. 8, 2023 (JP) ................................ 2023-190967

(51) Int. Cl.
*G01R 31/64* (2020.01)

(52) U.S. Cl.
CPC .................................. *G01R 31/64* (2020.01)

(58) Field of Classification Search
CPC ...... G01R 31/64; G01R 31/016; G01R 31/28; G01R 31/2893; B65G 43/00; B65G 47/80; B65G 2201/0214; B65G 2203/0283; B65G 2203/042; B65G 2812/14; B07C 5/344; B07C 5/368
See application file for complete search history.

(56) References Cited

U.S. PATENT DOCUMENTS

| | | | | |
|---|---|---|---|---|
| 4,406,373 A * | 9/1983 | Braden | B07C 5/344 324/759.03 |
| 6,435,338 B1 | 8/2002 | Iwamoto | |
| 6,565,309 B1 * | 5/2003 | Tsuchiya | H05K 13/022 198/377.04 |
| 2025/0128295 A1 * | 4/2025 | Komori | B07C 5/344 |

FOREIGN PATENT DOCUMENTS

| | | | | |
|---|---|---|---|---|
| JP | 2001-26318 A | | 1/2001 | |
| JP | 2004121990 A | * | 4/2004 | B65G 43/08 |
| JP | 3839583 B2 | * | 11/2006 | |

* cited by examiner

*Primary Examiner* — Son T Le
(74) *Attorney, Agent, or Firm* — Birch, Stewart, Kolasch & Birch, LLP

(57) ABSTRACT

A position detection sensor is provided on an index table, and a load track drive unit is provided on a load track. A control unit controls the load track drive unit to radially move the load track to adjust a radial position of the pocket with respect to the load track, based on a signal from the position detection sensor. The object is to smoothly fill electronic components stored in a load track into pockets in an index table.

8 Claims, 13 Drawing Sheets

ELECTRONIC COMPONENT TRANSFER SYSTEM

TECHNICAL FIELD

The present disclosure relates to an electronic component transfer system that transfers a number of electronic components that are arranged on an index table with a predetermined intervals therebetween, and electrically test the electronic components

BACKGROUND ART

All the manufactured electronic components, such as capacitors, are subjected to a predetermined test, and only acceptable products are shipped.

The electronic components are first put into a storage section of a load track, and are inserted from this storage section into pockets in an index table. The electronic components are electrically tested while being inserted in the pockets in the index table. In this case, there is a possibility that a position of the pocket in the index table is displaced with respect to the load track because of center deflection of a drive motor of the index table or the like. This makes it difficult for electronic components put into the storage section of the load track to be filled into the pockets, and decreases a filling ratio.

PATENT DOCUMENT 1

JP 2001-26318 A

DISCLOSURE OF THE INVENTION

The present disclosure has been made in view of the above circumstances. The object of the present disclosure is to provide an electronic component transfer system capable of reliably filling electronic components which have been put into a storage section of a load track into pockets in an index table.

The present disclosure is an electronic component transfer system comprising:

- a discoid index table having a plurality of circumferentially arranged pockets each for storing an electronic component, the index table being intermittently rotated step by step by an arrangement pitch of the pockets;
- a load track provided on the index table, and having storage sections corresponding to the pockets and storing the electronic components;
- a position detection sensor provided on the index table to detect a radial position of the pocket at a detection position;
- a load track drive unit that radially moves the load track; and
- a control unit;
- wherein the control unit drives the load track drive unit to radially move the load track per step of the index table to adjust the radial position of the pocket with respect to the load track, based on a signal from the position detection sensor.

The present discloser is the electronic component transfer system further comprising an electronic component test apparatus provided on the index table to electrically test the electronic components.

The present discloser is the electronic component transfer system wherein:

- the control unit drives the load track dive unit to radially move the load track to adjust the radial position of the pocket with respect to the load track, based on a signal from the position detection sensor, with no electronic component being stored in the pockets in the index table over all the circumference of the index table; and
- the control unit drives the load track drive unit to radially move the load track by the same movement amount as a radial movement amount at the same circumferential position when no electronic component is stored in the pockets in the index table, to adjust a radial position of the pocket with respect to the load track, with electronic components being stored in the pockets in the index table.

The present discloser is the electronic component transfer system wherein the control unit determines a radial displacement amount of the pocket per step of the index table based on a radial position of the pocket at the current detection position and a radial position of the pocket at the detection position which is one step prior to the current detection position, and drives the load track drive unit per step of the index table based on the radial displacement amount of the pocket to adjust a radial position of the pocket with respect to the load track.

The present discloser is the electronic component transfer system wherein the control unit previously drives the load track drive unit based on an initial radial position of the pocket at a visual position with respect to the load track to adjust the initial radial position of the pocket with respect to the load track.

The present discloser is the electronic component transfer system wherein the visual position of the pocket and the detection position of the pocket are the same.

The present discloser is the electronic component transfer system wherein the the visual position of the pocket and the detection position of the pocket are circumferentially separated by between at 3.6° or more and 36° or less.

The present disclosure is capable of reliably filling electronic components put into a storage section of a load track into pockets in an index table.

MODE FOR CARRYING OUT THE INVENTION

First Embodiment

A first embodiment of an electronic component transfer system is described hereunder with reference to the drawings. FIGS. 1 to 12 are views showing the first embodiment of the electronic component transfer system.

Figure 1A:
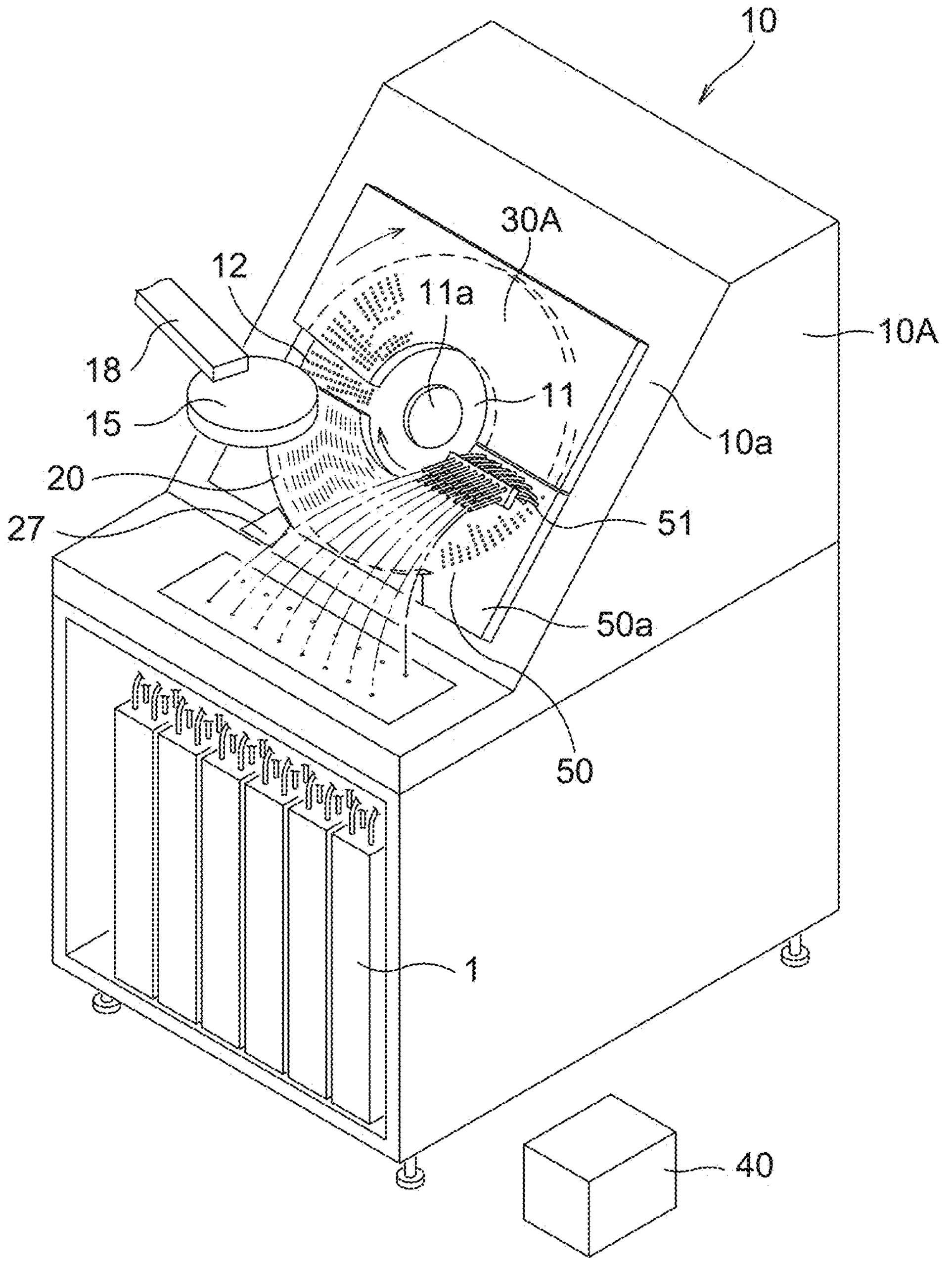
FIG. 1A is a schematic perspective view showing a first embodiment of an electronic component test system according to the present disclosure.
Figure 1B:
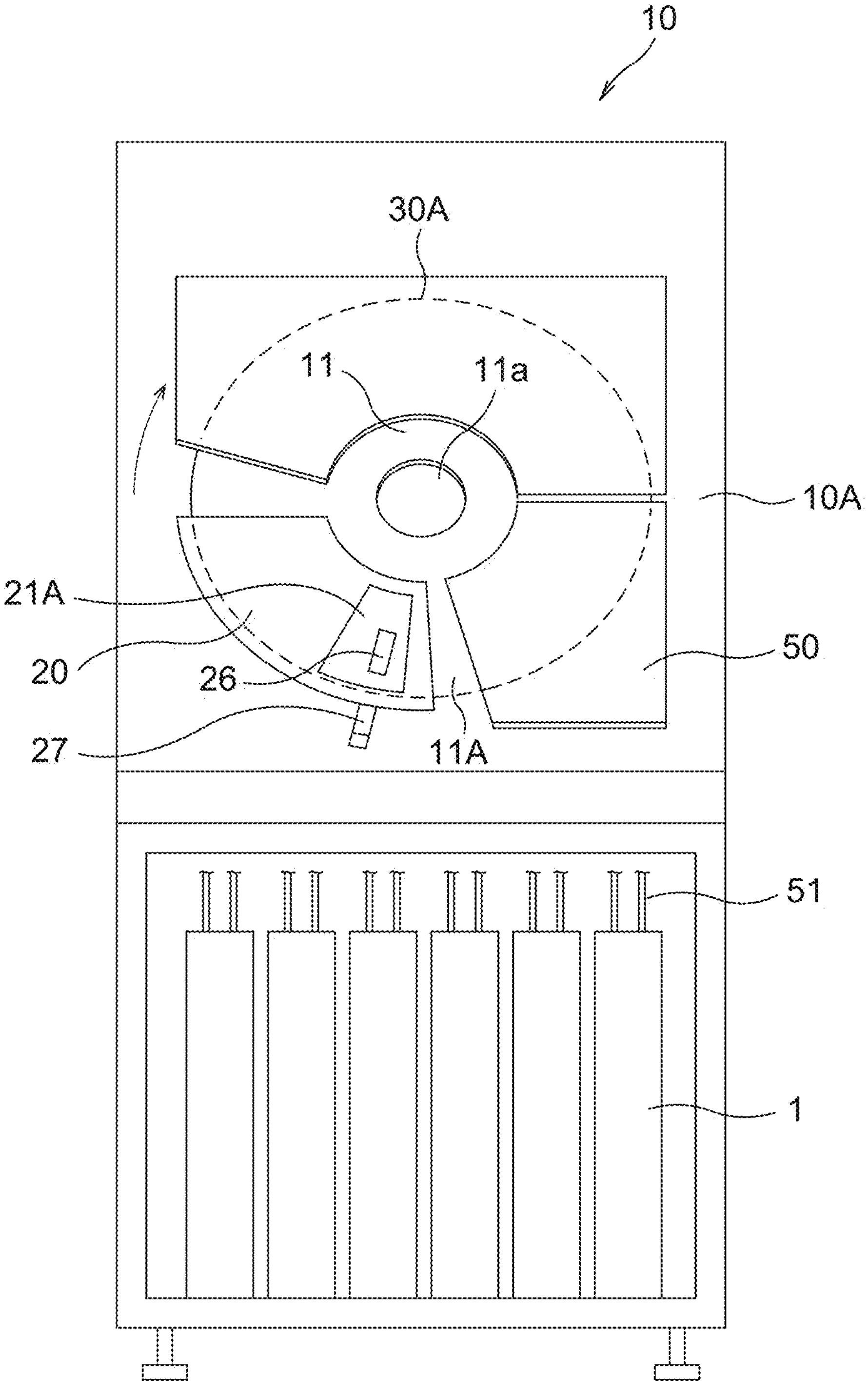
FIG. 1B is a schematic side view showing the first embodiment of the electronic component test system according to the present disclosure.

An overview of the electronic component transfer system 10 is described first with reference to FIGS. 1A and 1B.

As shown in FIGS. 1A and 1B, the electronic component transfer system 10 stores electronic components W (see FIG. 5), such as capacitors, in pockets 12 formed in an index table 11, and rotates the index table 11 intermittently to transfer the electronic components and to electrically test electronic components W, while applying a thermal load thereto. The electronic components W are classified according to the test results.

Such an electronic component transfer system 10 includes: a structure 10A having an inclined surface 10*a*; a discoid index table 11 provided on the inclined surface 10*a* of the structure 10A, and provided with pockets 12 circumferentially arranged in multiple rows, e.g., sixteen rows, each of which stores an electronic component W; an electronic component test apparatus 30A provided on the index table 11 to electrically test electronic components W while applying a thermal load thereto; an electronic component discharge unit 50 that discharges the electronic components W electrically tested by the electronic component test apparatus 30A; and a collection apparatus 1 connected to the electronic component discharge unit 50 through a discharge path 51.

In this embodiment, the inclined surface 10*a* of the structure 10 functions as a base that rotatably supports the index table 1. A heater (not shown) for heating electronic components W stored in the pockets 12 in the index table 11 is provided in the inclined surface 10*a*.

The inclined surface 10*a* of the structure 10A is inclined at about 60 degrees with respect to a horizontal plane. The index table 11 is intermittently rotated clockwise on the inclined surface 10*a*. Instead of placing the index table 11 on the inclined surface 10*a*, the index table 11 may be placed on a vertical surface (not shown) of the structure 10A.

In this specification, "above/upper" or "below/lower" means "above/upper" or "below/lower" when the electronic component transfer system 10 is arranged as shown in FIGS. 1A and 1B.

The electronic component test apparatus 30A has a plurality of probes 30 that electrically test the electronic components W stored in the pockets 12 in the index table 11. Specifically, each probe 30 is configured to electrically test an electronic component W while heating the electronic component W up to 100 to 170° C. and applying a thermal load thereto. The electronic components W are sorted by the electronic component discharge unit 50 based on the test results, and are sent to the collection apparatus 1. In this embodiment, the electronic component test apparatus 30A is provided on the inclined surface 10*a* of the structure 10A to cover the index table 11.

As described above, the probes 30 of the electronic component test apparatus 30A electorally test electronic components W while applying a thermal load thereto. The electric test or electric load performed by the probes 30 are as follows.

For example, an electric load performed by the probe 30 is as follows. When the electronic component W is a capacitor, a DC voltage load of 2.5 times a rated voltage is considered, for example, if a rated voltage is 10 V, a DC voltage load of 25 V is considered. When the electronic component W is a capacitor, an AC voltage load of 2.5 times a rated voltage is considered, for example, a maximum AC voltage of 25 V at 50 Hz is considered for a rated voltage of 10 V. Furthermore, when the electronic component is an inductor, a current load of 1.5 times a rated current is considered, for example, a load of 1,500 mA is considered for a rated DC current of 1,000 mA.

In addition to the function of performing an electric load, the probe 30 has a function of electorally testing the electronic component W while applying a thermal load thereto. When the electronic component W is a capacitor, the probe 30 can also detect a capacitance (C), a loss factor (Df), and a quality factor (Q: reciprocal of Df) Alternatively, the probe 30 can also detect contact between the probe 30 and the electronic component W by means of a leakage current (an insulation resistance is calculated from a leakage current and an applied voltage), a DC voltage bias capacitance (capacitance at AC with DC voltage applied), a withstand voltage (BDV breakdown voltage), and an inrush current. Alternatively, when the electronic component W is an inductor, the probe 30 can detect an inductance (L), a DC resistance (Rdc), and a withstand current.

In this embodiment, the probes 30 of the electronic component test apparatus 30A electrically test the electronic components W while applying a thermal load thereto, in general. The electronic components W are sored by the electronic component discharge unit 50 based on the results of the electric test, and are sent to the collection apparatus 1.

Next, the electronic component test apparatus 30A is further described with reference to FIG. 5. The electronic component test apparatus 30A has the probes 30 that electrically test the electronic components W as described above. Each probe 30 is provided correspondingly to each electronic component W.

Figure 5:
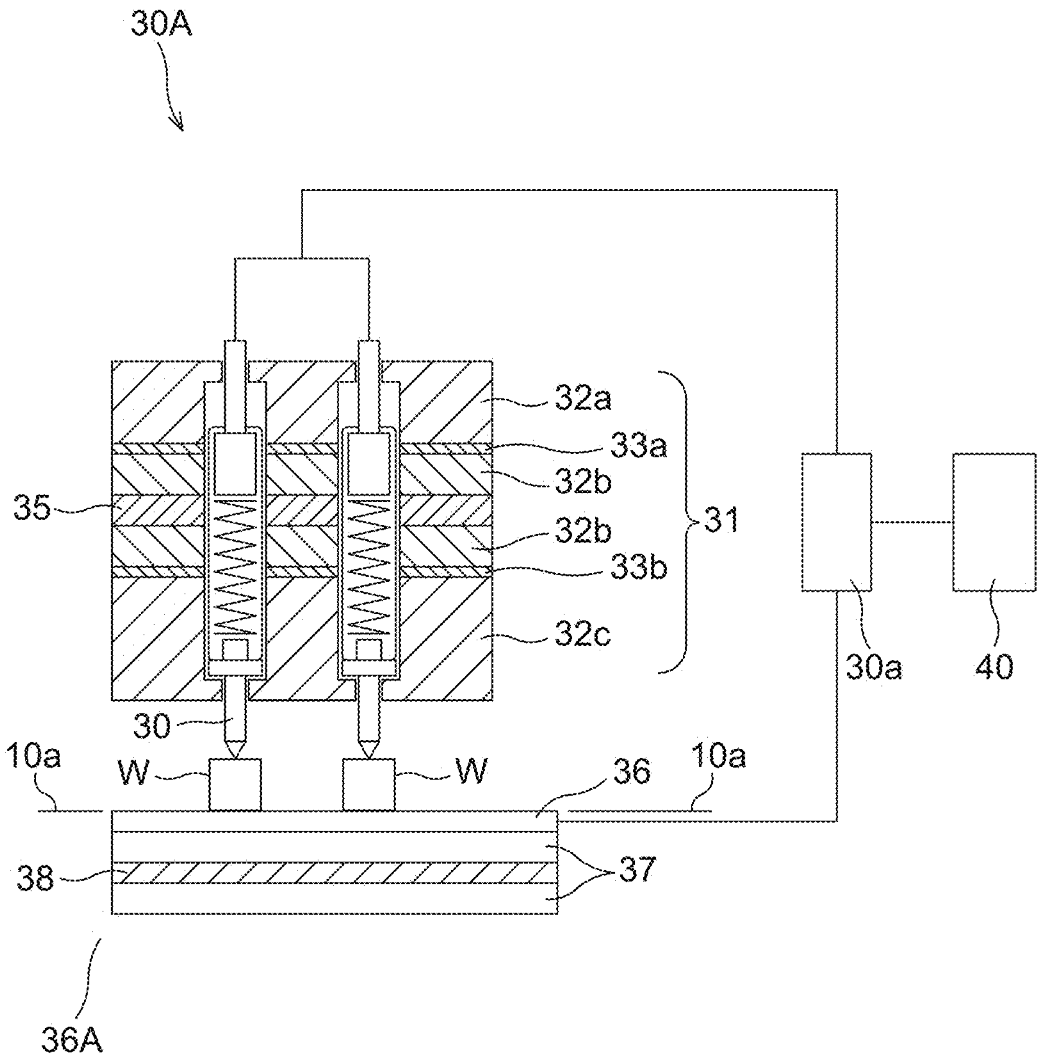
FIG. 5 is a schematic view showing a structure of a probe.
Figure 6:
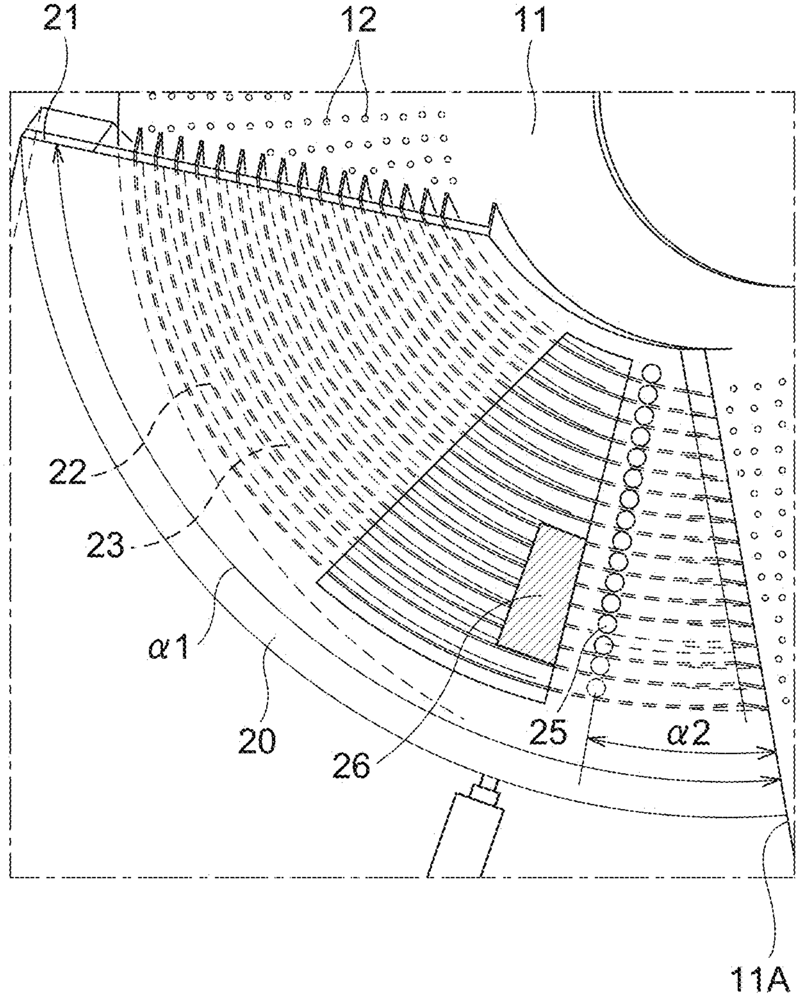
FIG. 6 is a view showing the load track provided on the index table.
Figure 7:
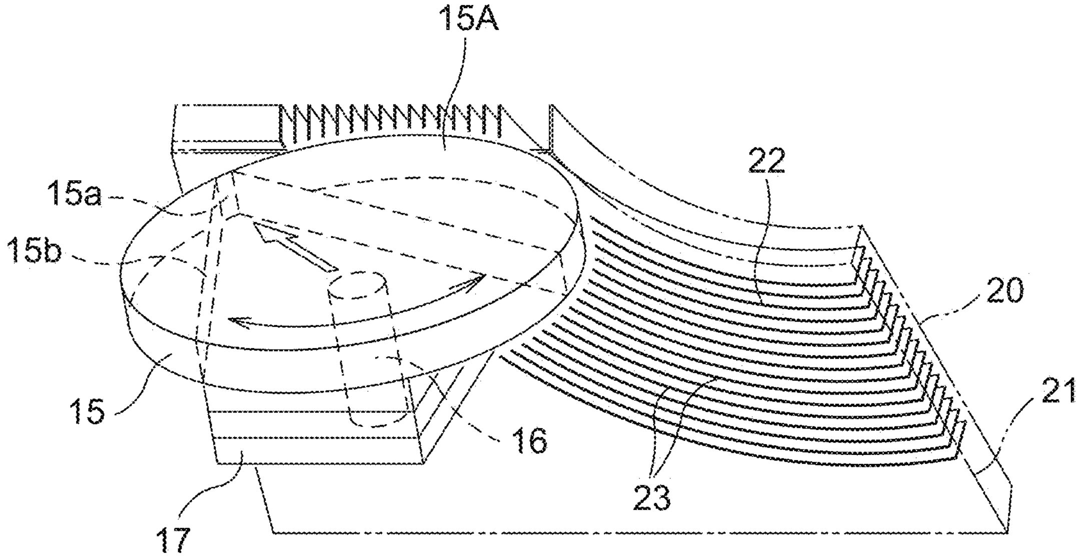
FIG. 7 is a view showing a connection structure between the load track and an electronic component supply unit.

Further, as shown in FIG. 5, each probe 30 is held by a probe holder 31. The probe 30 is made of a material with high thermal expansion, high thermal conductivity, and high electrical conductivity, for example, a copper alloy such as beryllium copper.

On the other hand, the probe holder 31 holding each probe 30 includes multi-layered, e.g., three layered probe holder bodies 32*a*, 32*b*, 32*c*, and sheet members 33*a*, 33*b* interposed between the respective probe holder bodies 32*a*, 32*b* 32*c*. In this embodiment, the probe holder bodies 32*a*, 32*b*, 32*c* are made of a material with low thermal expansion, low thermal conductivity, and low electrical conductivity, such as a Photoveel material.

A probe heater 35 for heating the entire probe holder 31 is provided in the middle probe holder body 32*c* of the probe holder. Since each of the probe holder bodies has low thermal conductivity as a whole, heat from the probe heater 35 is difficult to be transferred to the entire probe holder 31.

In this embodiment, graphite sheet members with high thermal conductivity and high electrical conductivity are used as sheet members 33*a*, 33*b* interposed between the probe holder bodies 32*a*, 32*b*, 32*c*. This allows the probes 30 to be effectively heated by the probe holder 31, and the probes 30 can heat the electronic components W while applying a thermal load thereto, and simultaneously therewith electrically test the electronic components W.

Each sheet member 33*a*, 33*b* made of graphite sheet members has high thermal conductivity and high electrical conductivity. Thus, it is preferable to form a through hole, which is considerably larger than an external diameter of the probe 30, in the sheet the sheet member 33*a*, 33*b*, and to place the probe 30 inside this through hole, in order to prevent conduction between the sheet member 33*a*, 33*b* and the probe 30.

As shown in FIG. 5, an electrode part 36A, which electrically tests the electronic components W with the probes 30, is provided below the probes 30 held by the probe holder 31. The electrode part 36A is supported by the inclined surface 10*a* of the structure 10A.

The electrode part 36A has an electrode 36 that electrically tests the electronic components W with the probes 30, and an electrode holder 37 that supports the electrode 36. A probe heater 38 that heats the electrode holder 37 is provided in the electrode holder 37.

The probe heater 38 heats the electrode 36, and the electrode 36 can also heat the electronic components W.

The probes 30 held by the probe holder 31, and the electrode 36 of the electrode part 36A are connected to an electric circuit 30*a*. This electric circuit 30*a* conducts an electric test to the electronic components W between the probes 30 and the electrode 36.

As shown in FIG. 5, the electric circuit 30*a* is further connected to a control unit 40.

In this embodiment, the probes 30, the probe holder 31 holding the probes 30 and including the probe heater 35, the electrode part 36A provided below the probes 30, and the electric circuit 30*a* constitute the electronic component test apparatus 30A.

Next, other constituent components are further described. As shown in FIGS. 1A and 1B, the electronic component discharge unit 50 has an electronic component discharge unit body 50*a* provided on the inclined surface 10*a* of the structure 10A, and a tubular discharge path 51 attached to the electronic component discharge unit body 50*a* to discharge outside the electronic components W stored in the pockets 12 in the index table 11. The collection apparatus 1 is connected to the tubular discharge path 51.

In this embodiment, the probes 30 of the electronic component test apparatus 30 electrically test the electronic components W while applying a thermal load thereto. Then, the electronic component discharge unit 50 sorts the electronic components W based on the electric test results, and sends them from the discharge path 51 to a predetermined collection apparatus 1.

Specifically, results of the electric tests by the probes 30 are transmitted from the electric circuit 30*a* to the control unit 40. Based on the electric test results, the control unit 40 controls the electronic component discharge unit 50 such that a not-shown air jet mechanism provided on the inclined surface 10*a* of the structure 10A jets air to send the electronic components W in the pockets 12 in the index table 11 to a predetermined collection apparatus 1. In this embodiment, a plurality of collection apparatuses 1, e.g., six collection apparatuses 1 are installed for each of sort types of the electronic components W to be sorted based on the results of the electric tests by the probes 30. In this embodiment, each collection apparatus 1 is installed below the structure 10A.

The electronic components W in the pockets 12 in the index table 11 are sorted in the electronic component discharge unit, and are respectively sent to predetermined collection apparatuses 1 through the discharge path 51.

Next, other constituent components are further described. As shown in FIGS. 1A to 3 and 6 to 9, the inclined surface (base) 10*a* of the structure 10A is provided with a load track 20 correspondingly to a lower part of the index table 11. An electronic component supply unit 15 that supplies the load track 20 with electronic components W, is connected to the load track 20. The load track 20 has a load track body 21, and a plurality of wall surfaces 22 provided in the load track body 21. A storage section 23 for storing the electronic components W is formed between the wall surfaces 22. The electronic components W to be stored in the corresponding pockets 12 in the index table 11 are stored in the storage section 23 (see FIGS. 6 to 9).

A supply feeder 18 that replenishes the electronic component supply unit 15 with electronic components W is connected to the electronic component supply unit 15.

The index table 11 is intermittently rotated about a rotation shaft 11*a*. The rotation shaft 11*a* of the index table 11 is driven by a not-shown drive mechanism.

The aforementioned constituent components, e.g., the drive mechanism of the index table 11, the supply feeder 18, the electronic component supply unit 15, the electronic component test apparatus 30A, probes 30, and the air jet mechanism of the electronic component discharge unit 50 are driven and controlled by the control unit 40. A position detection sensor 26 that detects a position of the pocket 12, which is described later, is connected to the control unit 40. A load track drive unit 27, which is described later, is driven and controlled by the control unit 40 based on a signal from the position detection sensor 26.

As described above, in this embodiment, the probes 30 of the electronic component test apparatus 30A heat an electronic component W while applying a thermal load thereto, and simultaneously therewith electrically test electronic component W.

In this case, if the electronic component transfer system 10 can quickly and reliably heat the electronic components W and can maintain the electronic components W at a high temperature, the electronic components can be electrically tested efficiently and quickly while being applied by a thermal load.

Thus, in this embodiment, a not-shown heater is installed inside the inclined surface 10*a* of the structure 10A. In addition, as described above, the probe heater 35 is also provided in the probe holder 31 of the electronic component test apparatus 30A. Moreover, not-shown heaters are installed on an inner surface of the load track body 32 of the load track 20 and on an inner surface of the electronic component discharge unit body 50*a* of the electronic component discharge unit 50.

Next, the load track 20 provided on the index table 11, the electronic component supply unit 15 that supplies electronic components W to the load track 20, and the supply feeder 18 that replenishes the electronic component supply unit 15 with electronic components W are described with reference to FIGS. 6 to 9.

As shown in FIGS. 6 to 9, the load track 20 has the storage sections 23 that store electronic components W on the index table 11. The storage sections 23 are arranged in sixteen lines correspondingly to the pockets 12 in the index table 11, which are arranged in sixteen lines.

Namely, the load track 20 has the load track body 21, and the wall surfaces 22 provided in the load track body 21. The storage sections 23 in sixteen lines are formed between the walls surfaces 22 of the load track 20. Each storage section 23 stores therein electronic components W to be stored in the pocket 12 in the corresponding line of the index table 11.

In this case, since the pockets 12 in sixteen lines are circumferentially arranged in the index table 11, the wall surfaces 22 of the load track 20, and the storage sections 23 formed between the wall surfaces 22 are also circumferentially arranged correspondingly to the pockets 12 in sixteen lines.

The electronic component supply unit 15 has a partition plate 15*b* of a flat fan shape in the plan view. An opening 15*a* is formed in a base part of the partition plate 15*b*. When the electronic component supply unit 15 is rotated, the electronic components W stored in the partition plate 15*b* are configured to be supplied into the desired storage section 23 from the opening 15*a* (see FIGS. 7 and 8).

In this embodiment, the electronic component supply unit 15 has the supply unit body 15A. The partition plate 15*b* having the opening 15*a* is provided in the supply unit body 15A.

The supply unit 15A of the electronic component supply unit 15 is mounted on a base 17 through a rotation shaft 16. The position of the opening 15*a* varies as the rotation shaft 16 is rotated, and the electronic components W stored in the partition plate 15*b* are put into the desired storage section 23.

Figure 8:
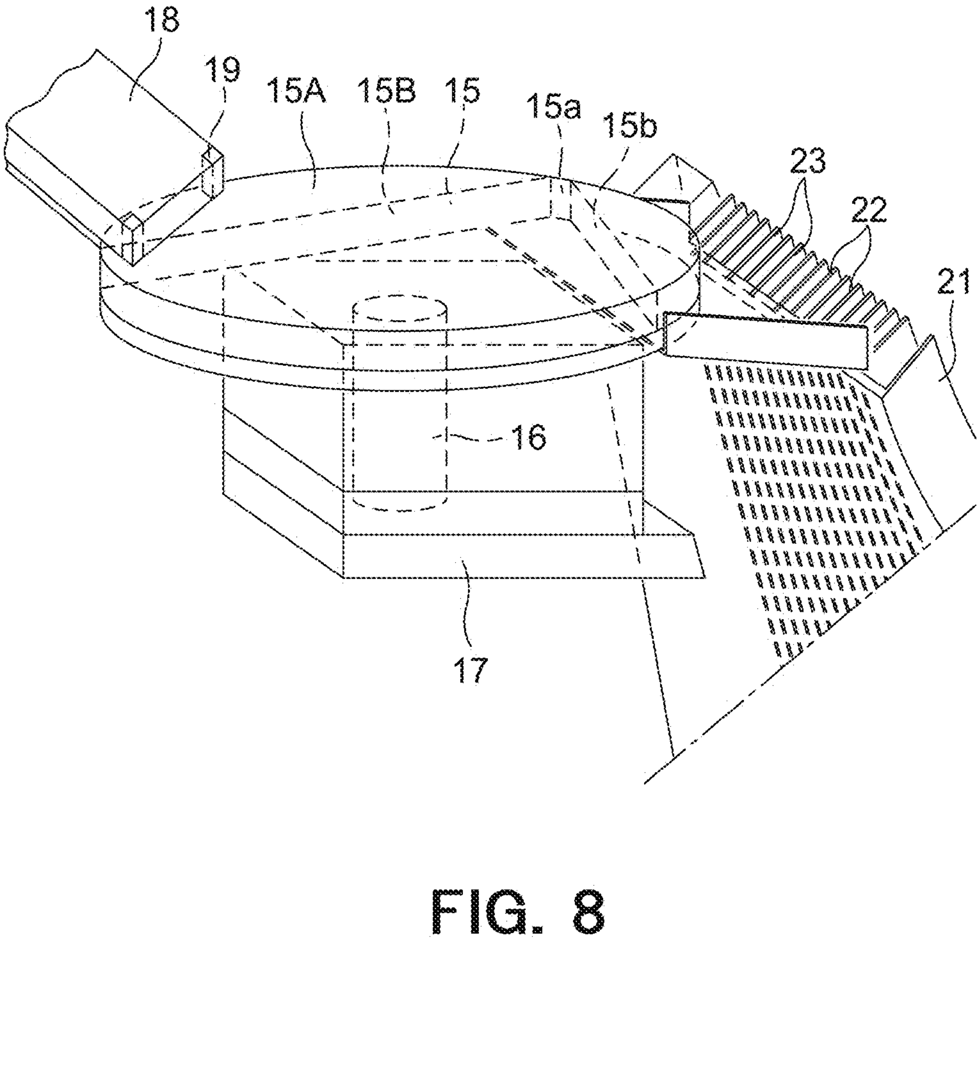
FIG. 8 is a view showing a connection structure among the load track, the electronic component supply unit, and a supply feeder.
Figure 9:
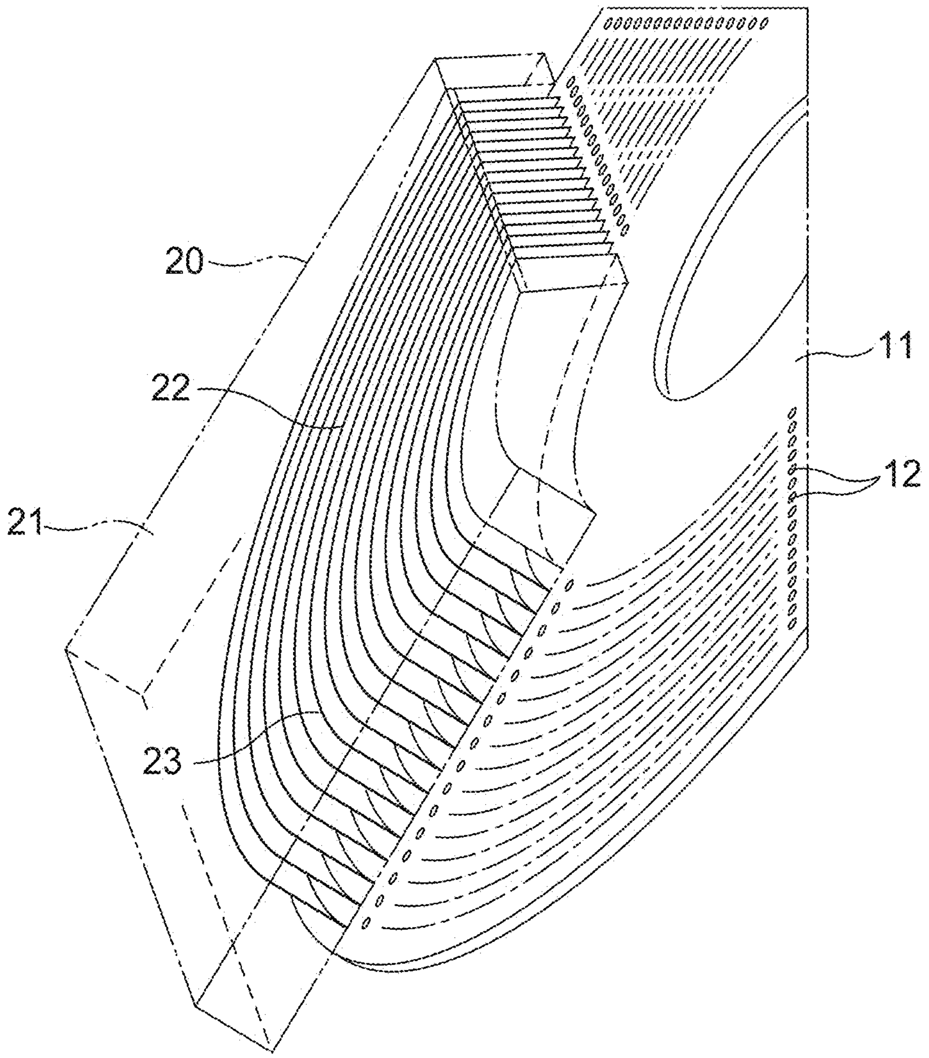
FIG. 9 is a view showing a connection structure between the index table and the load track.

As shown in FIG. 8, the supply feeder 18 that replenishes electronic components W into the electronic component supply unit 15 is connected to the electronic component supply unit 15. A supply rate detection sensor 19 that detects a supply rate of the electronic components W is provided at an outlet of the supply feeder 18. Since the electronic components W replenished from the supply feeder 18 into the electronic component supply unit 15 are put into the desired storage section 23 from the electronic component supply unit 15 through the opening 15*a*, the supply rate detection sensor 19 functions to detect a supply rate of the electronic components W supplied from the electronic component supply unit 15 to the storage section 23.

The respective storage sections 23 of the load track 20 are arranged at least within a range of 45 degrees downstream of a lower end 11A of the index table 11. In this embodiment, the respective storage sections 23 are arranged over a range α1 of 90 degrees downstream of the lower end 11A of the index table 11 (see FIG. 6).

An electronic component detection unit 25 that detects whether an electronic component W is stored in the pocket 12 may be provided on the load track 20 correspondingly to each storage section 23, at a position within a range α2 of 10 to 20 degrees downstream of the lower end 11A of the index table 11. In this embodiment, the electronic component detection units 25 are provided at 15 degree positions downstream of the lower end 11A.

The electronic component detection units 25 provided on the load track 20 are provided correspondingly to the respective storage sections 23 as described above. Each electronic component detection unit 25 may be either a transmission type sensor that projects light from a light projector on the back side and receives the light on the front side to detect an electronic component W in the pocket 12, or a reflection type sensor that projects light from the front side to an electronic component W in the pocket 12 to detect reflected light from the electronic component W.

The index table 11 that transfers electronic components W is made of a synthetic resin, which is relatively easily thermally expands.

On the other hand, the probe holder 31 of the electronic component test apparatus 30A, the load track body 21, and the electronic component discharge unit body 50*a* of the electronic component discharge unit 50 are made of a metal material, which is relatively resistant to thermally expands, such as Invar material or Photoveel material (registered trademark).

The index table 11 may cause center deflection during operation. In addition, the index table 11 thermally expands by heating during operation. During such operation, due to the center deflection or thermal expansion of the index table 11, the pocket 12 in the index table 11 may particularly radially displace with respect to the load track 20 which does not thermally expands.

Figure 11:
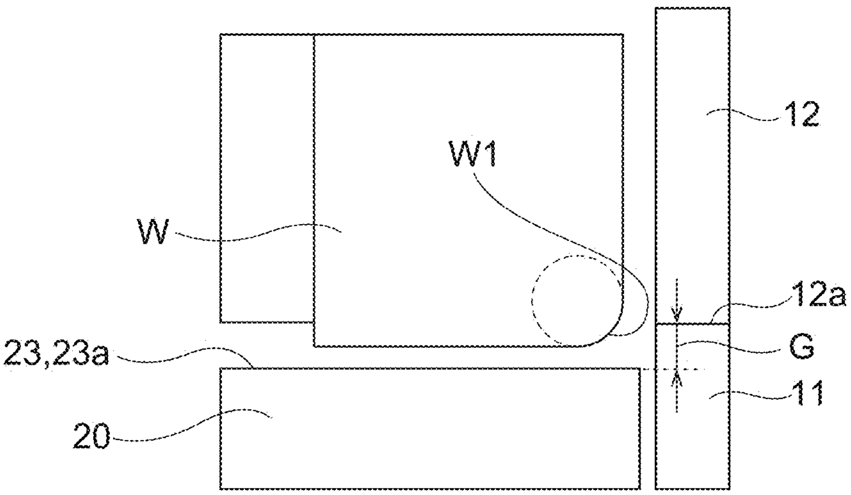
FIG. 11 is a view showing a state in which an electronic component in a load track body of the load track is inserted into a pocket.

When a pocket 12 in the index table 11 radially displaces with respect to the load track 20, a step G occurs between a bottom surface 23*a* of the storage section 23 of the load track 20 and a side surface 12*a* of the pocket 12, so that it may be difficult for the electronic component W stored in the storage section 23 of the load track 20 to be put into the pocket 12 (see FIG. 11).

In this embodiment, the following constituent members are provided in order to adjust radial displacement of the pocket 12 in the index table 11 with respect to the load track 20, so that an electronic component W in the storage section 23 of the load track 20 can be smoothly put into the pocket 12.

Figure 2A:
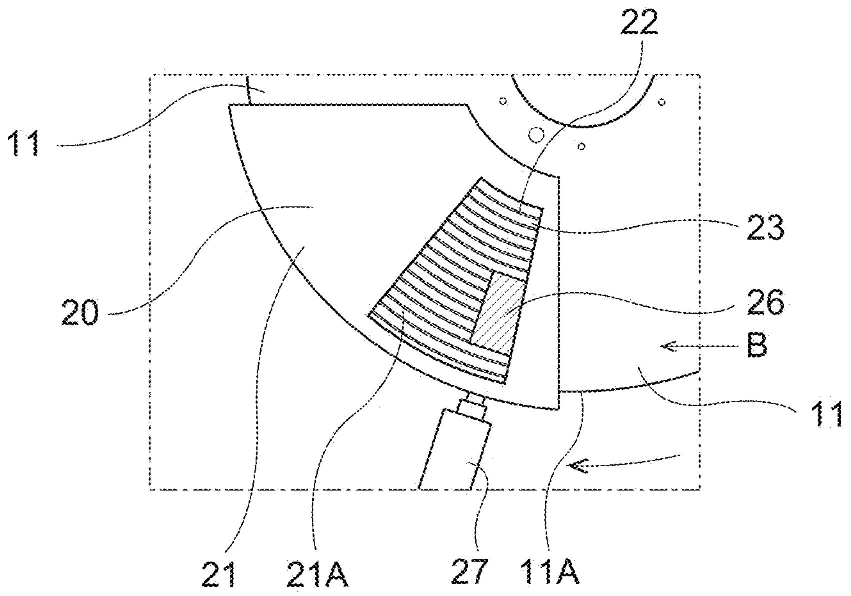
FIG. 2A is a schematic view showing a load track provided on an index table.
Figure 2B:
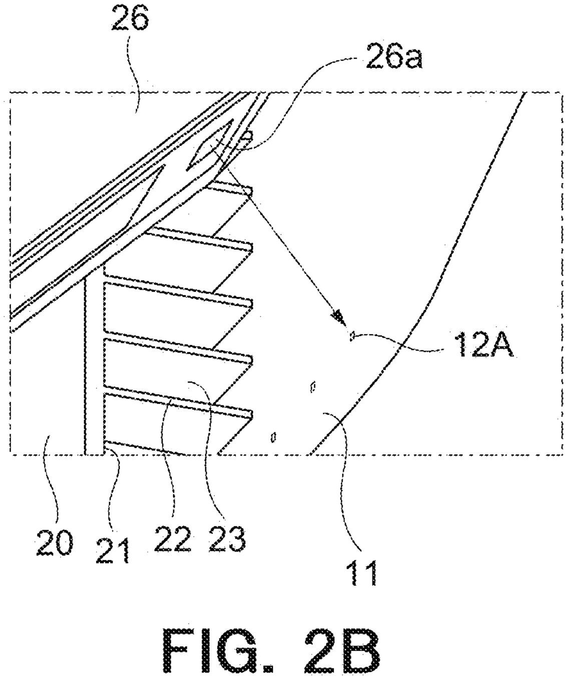
FIG. 2B is view seen from a B line direction in FIG. 2A, showing a positional relationship between a position detection sensor and a pocket at a detection position.
Figure 3:
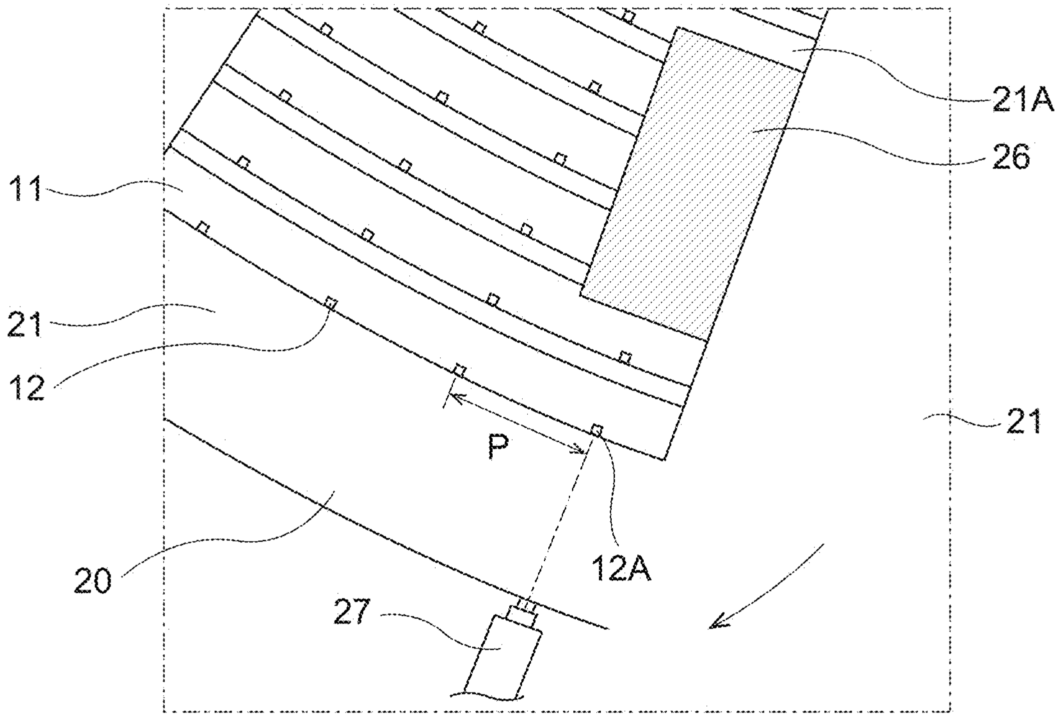
FIG. 3 is an enlarged view showing the load track.

Namely, as shown in FIGS. 2A, 2B and 3, a glass window 21A is attached to the surface of the load track body 21 of the load track 20. A position of the pocket 12 in the index table 11 can be visually confirmed from outside through the glass window 21A.

In addition, the position detection sensor 26 that detects a radial position of the pocket 12 in the index table 11 through the glass window 21A is provided near the load track body 21 of the load track 20. The position detection sensor 26 is fixed on the inclined surface 10*a* of the structure 10A.

Further, the load track body 21 of the load track 20 is movable along a radial direction of the index table 11. A load track drive unit 27 that radially moves the load track body 21 is provided on an outer periphery of the load track body 21.

The load track drive unit 27 moves the load track body 21 along the radial direction of the index table 11 to adjust a radial position of the pocket 12 in the index table 11 with respect to the load track body 21 of the load track 20. By adjusting the radial position of the pocket 12 in the index table 11 with respect to the load track body 21 of the load track 20 to reduce as much as possible the step G between the bottom surface 23*a* of the storage section 23 of the load track 20 and the side surface 12*a* of the pocket 12, an electronic component W in the storage section 23 can be smoothly inserted into the pocket 12 (see FIG. 11).

Generally, an electronic component W has a curved portion W1. The curved portion of the recent electronic component W is reduced to R=20 μm, as compared with the conventional R=100 μm.

In this case, an electronic component W with R=100 μm can be smoothly inserted into the pocket 12 from the curved portion W1, even when the step G between the bottom surface 23*a* of the storage section 23 of the load track 20 and the side surface 12*a* of the pocket 12 is about 50 μm.

However, since a curved portion W1 of a recent electronic component W is as small as R=20 μm, it is difficult to insert an electronic component W in the storage section 23 into the pocket 12 in the index table 11, when the step G between the bottom surface 23*a* of the storage section 23 of the load track 20 and the side surface 12*a* of the pocket 12 is 10 μm or more.

In this embodiment, the aforementioned position detection sensor 26 and the load track drive unit 27 are provided, and a signal from the position detection sensor 26 is transmitted to the control unit 40. Then, the control unit 40 controls the load track drive unit 27 to radially move the load track body 21 of the load track 20, based on the position from the position detection sensor 26.

Thus, the pocket 12 in the index table 11 is radially displaced with respect to the load track 20, so that, even when there is relatively a large step G between the bottom surface 23*a* of the storage section 23 of the load track 20 and the side surface 12*a* of the pocket 12, the load track body 21 can be moved along the radial direction of the index table 11 by the load track drive unit 27. This can reduce as much as the step G between the bottom surface 23*a* of the storage section 23 of the load track 20 and the side surface 12*a* down to, for example, 10 μm or less.

This allows the electronic components W in the storage section 23 to be smoothly inserted into the pockets 12 in the index table 11.

In this embodiment, the load track drive unit 27 is arranged on a radial extension line of the position detection sensor 26. However, not limited thereto, the load track drive unit 27 may be arranged at circumferentially a center position of the load track body 21, instead of being arranged on a radial extension line of the position detection sensor 26.

Figure 10A:
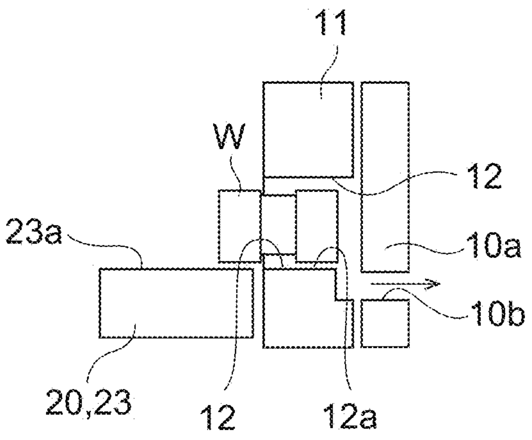
FIG. 10A is a view showing an operation of the electronic component transfer system according to the present disclosure.
Figure 10B:
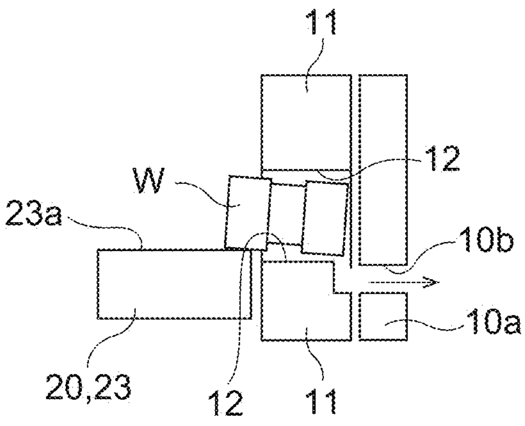
FIG. 10B is a view showing an operation of an electronic component transfer system as a comparative example.
Figure 10C:
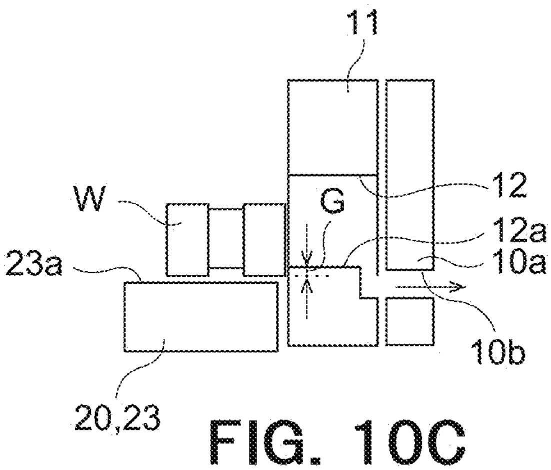
FIG. 10C is a view showing an operation of an electronic component transfer system as a comparative example.

Also in this embodiment, a suction hole 10*b* is formed in the inclined surface 10*a* of the structure 10A, for suctioning an electronic component W stored in the storage section 23 of the load track 20 into the pocket 12 in the index table 11 (see FIGS. 10A to 10C).

Next, an operation of the embodiment as structured above is described.

Before electronic components W such as capacitors are supplied to the electronic component supply unit 15, i.e., before the electronic components W are supplied into the pockets 12 in the index table 11 (with the pockets 12 being empty), a position of the pocket 12 with respect to the load track 20 is adjusted first. In this case, a radial position of the pocket 12A at a detection position is detected by the position detection sensor 26, and the control unit 40 drives and controls the load track drive unit 27 based on a signal from the position detection sensor 26 to radially move the load track body 21 of the load track 20.

Figure 4:
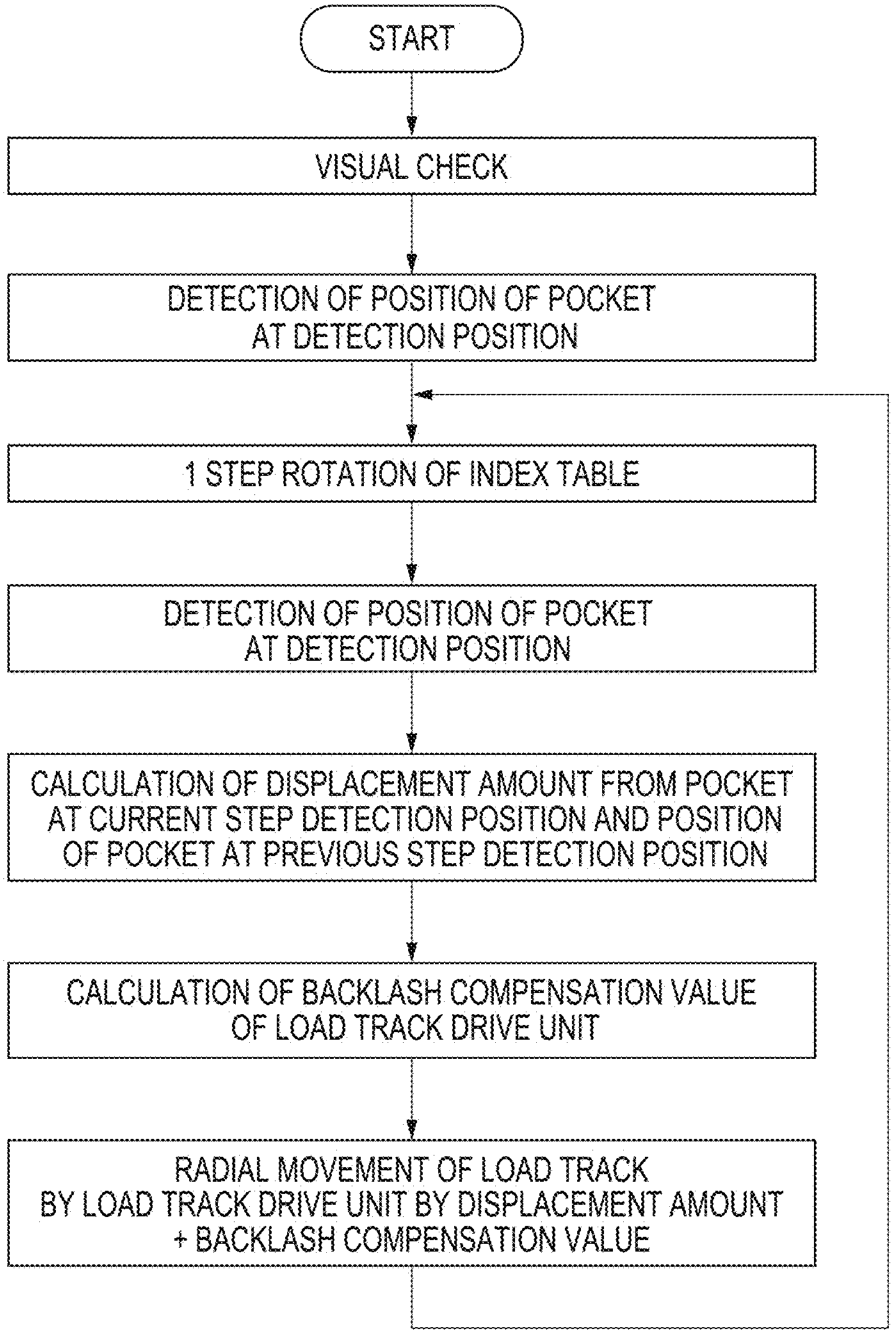
FIG. 4 is a flowchart showing an operation of an electronic component transfer system.

Next, specific operations of the position detection sensor 26 and the load track drive unit 27 are described using a flowchart shown in FIG. 4.

In this case, the electronic component transfer system 10 having the following specific characteristics is described by way of example.

The index table 11 of the electronic component transfer system 10 has a diameter of 300 mm and a thickness of 0.9 mm.

The pockets 12 in the index table 11 are intended for 1005 electronic components W. Each pocket 12 has a square shape with 0.7 mm on each side, when the index table 11 is seen from a normal direction.

The pockets 12 provided in the index table 11 are circumferentially arranged in sixteen lines. The pockets 12 in each line are arranged at 100 equal divisions of 360° around the index table 11.

The index table 11 is assumed to be radially displaced by a maximum of 50 μm because of center deflection.

Further, in this embodiment, the control unit 40 drives and controls the load track drive unit 27 in such a manner that the radial displacement of the pocket with respect to the load track body 21 of the load track 20 becomes less than 10 μm.

Detection accuracy of the position detection senor 26 is 1 μm or less. The load track drive unit 27 has a drive element including a drive motor and a transmission mechanism. Movement accuracy of the load track drive unit 27 is 1 μm or less.

On the assumption that the electronic component transfer system 10 according to the present disclosure has the above characteristics, operations of the position detection sensor 26 and the load track drive unit 27 are described below.

As shown in FIG. 4, a pocket 12A at a detection position of the index table 11 is visually confirmed previously. Based on an initial radial position of the pocket 12A at the detection position, the control unit 40 drives the load track drive unit 27. In this embodiment, the pocket 12A at the detection position and the position detection sensor 26 are arranged side by side in the same radial direction of the index table 11 (see FIG. 3).

The initial radial position of the pocket 12 with respect to the load track body 21 of the load track 20 is adjusted in this manner, so that the initial radial position of the pocket 12 with respect to the load track body 21 is set (see FIGS. 2A, 2B and 3).

In this embodiment, since the initial radial position of the pocket 12A at the detection position is set visually, the pocket 12A at the detection position can be said as pocket 12A at a visual position.

Figure 12:
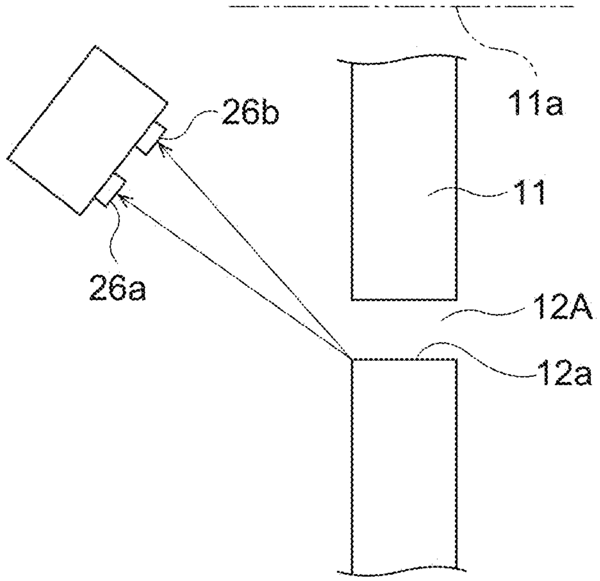
FIG. 12 is a view showing an operation of the position detection sensor.

Then, a laser beam is projected from a laser beam projector 26*a* of the position detection sensor 26 to the pocket 12A at the detection position (see FIG. 12). The laser beam from the laser beam projector 26*a* is reflected by the side surface 12*a* of the pocket 12A, which is located radially outward, and is received by a laser beam receptor 26*b* of the position detection sensor 26, so that a position of the side surface 12*a* of the pocket 12A, which is located radially outward, is detected. The radial position of the pocket 12A at the detection position is detected by the position detection sensor 26 in this manner.

In this embodiment, the pocket 12A at the detection position is the pocket 12A in the outermost line in the radial direction of the index table 11. Since the pocket 12A in the outermost line in the radial direction of the index table 11 is determined as the pocket 12A at the detection position, displacement of the pocket 12, which is largely displaced by center deflection of the index table 11, can be reliably detected, so that radial displacement of the pocket 12 with respect to the load track 20 can be accurately detected. A detection signal from the position detection sensor 26 is transmitted to the control unit 40.

Then, the index table 11 is rotated one step about the rotation shaft 11*a* by a circumferential arrangement pitch P between the pockets 12, and the index table 11 stops thereafter (see FIG. 3).

Then, the radial position of the pocket 12A which has then arrived at the detection position is detected by the position detection sensor 26 similarly to the above.

Then, the radial position of the pocket 12A at the detection position, which has been detected by the position detection sensor 26, is transmitted to the control unit 40.

The control unit 40 determines a radial displacement amount of the pocket 12A per step of the index table 11, based on the radial position of the pocket 12A at the current detection position, and the radial position of the pocket 12A at the detection position which is one step prior to the current detection position.

Then, the control unit 40 controls the load track drive unit 27 to radially move the load track body 21 of the load track 20, based on the radial displacement amount of the pocket 12A per step of the index table 11.

In this case, the control unit 40 may determine a backlash compensation value for the drive element including the drive motor and the transmission mechanism. At this time, the control unit 40 can determine a value obtained by adding the backlash compensation value of the drive element to the radial displacement amount of the pocket 12A per step of the index table 11, and can control based on the value the load tack drive unit 27 to radially move the load track body 21 of the load track 20 by the load track drive unit 27.

Since the control unit 40 drives and controls the load track dive unit 27 in consideration of the backlash compensation value of the drive element of the load track drive unit 27, the load track body 21 of the load track 20 can be driven by an accurate movement amount.

Then, electronic components W such as capacitors in the electronic component supply unit 15 are supplied to the desired storage section 23 of the load track 20 and are stored in the storage section 23.

During this process, the index table 11 is rotated clockwise, so that the electronic components W stored in the storage section 23 are inserted in the respective pockets 12 in the index table 11. In this case, since the inclined surface 10*a* positioned on the back side of the index table 11 is provided with the suction hole 10*b*, the electronic component W in the storage section 23 is suctioned by the suction hole 10*b* of the inclined surface 10*a* so as to be inserted in each pocket 12 in the index table 11.

When the electronic components W are supplied from the electronic component supply unit 15 to the respective storage sections 23, the electronic components W are put into the storage section 23 from its upper part through the opening 15*a* of the electronic component supply unit 15, and the electronic components W put into the storage section 23 fall by gravity and are stored in a lower part of each storage section 23.

While the electronic components W are put into each storage section 23 from the electronic component supply unit 15, the index table 11 is intermittently rotated clockwise. This causes the electronic components W in each storage section 23 to be stored in a mass around a position of 15 degrees downstream of the lower end 11A of the index table 11, by frictional force with the index table 11. The number of electronic components W stored in a mass in each storage section 23 becomes maximum around the position of 15 degrees downstream of the lower end 11. The number of electronic components W gradually decreases to a position of 45° toward the downstream side, and similarly gradually decreases to the upstream side of the index table 11 up to the lower end 11A.

Thus, the number of electronic components W in each storage section 23 forms a chevron around the position of 15 degrees downstream of the lower end 11A. The electronic components W are present up to the position of 45° toward the downstream side with the number thereof gradually decreasing, and are similarly present to the upstream side up to the lower end 11A with the number thereof gradually decreasing.

According to this embodiment, the number of electronic components W in each storage section 23 forms a chevron around the position of 15 degrees downstream of the lower end 11A, and the electronic components W are distributed from the position of 45 degrees downstream of the lower end 11A up to the lower end 11A. Thus, the electronic components W are stored in the pockets 12 in the index table 11 within a range from the position of 45 degrees downstream of the lower end 11A up to the lower end 11A.

In this embodiment, the load track 20 is provided with the electronic component detection unit 25 within a range α2 of 10 degrees to 20 degrees downstream of the lower end 11A, preferably at a position of 15 degrees downstream of the lower end 11A. Thus, the electronic component detection unit 25 can detect whether the electronic component W is stored in the pocket 12 at the set position of the electronic component detection unit 25.

Since the electronic component detection unit 25 detects the presence of the electronic component W in the pocket 12, appropriate quantities of electronic components W can be supplied into the load track 20, as described below, and the electronic components W can be reliably supplied into the pockets 12. During this process, the control unit 40 radially moves the load track 20 with the electronic components W being stored in the pockets 12 in the index table 11, per step of the index table 11, by the same movement amount as a radial movement amount at the same circumferential position when no electronic component W is supplied into the pocket 12 in the index table. Namely, when the electronic component W is supplied and stored in each pocket 12 in the index table 11, it is difficult for the position detection sensor 26 to detect a radial position of each pocket 12, because of the presence of the electronic component W. Thus, in this embodiment, a radial position of the pocket 12 is once detected by the position detection sensor 26, without any electronic component W being stored in the pocket 12 in the index table 11. Then, the load track drive unit 27 radially moves the load track body 21 of the load track 20 to adjust the radial position of the pocket 12 with respect to the load track 20. The control unit 40 records a radial movement amount of the load track body 21 at a predetermined circumferential position of the index table 11, without any electronic component W being stored in the pocket 12. Then, when the electronic component W is stored in each pocket 12 in the index table 11, the control unit 40 radially moves the load track 20 per step of the index table, by the same previously recorded movement amount as the radial movement amount at the same circumferential position when no electronic component W is supplied into the pockets 12 in the index table 11.

Next, an effect of radially moving the load track body of the load track 20 by the load track drive unit 27 is described with reference to FIGS. 10A to 10C.

According to this embodiment, the control unit 40 controls the load track drive unit 27 to radially move the load track body 21 of the load track 20 such that the radial displacement amount decreases, based on a radial displacement amount of the pocket 12A at the detection position of the index table 11. As shown in FIG. 10A, this can reduce as much as possible the step G between the bottom surface 23*a* of the storage section 23 of the load track 20 and the side surface 12*a* of the pocket 12. For example, the step G can be reduced down to 10 μm or less. This allows the electronic components W in the storage section 23 to be smoothly inserted into the pockets 12 in the index table 11, whereby a filling ratio of the electronic components W to the pockets 12 can be raised to nearly 100% (see FIGS. 10A and 11).

On the other hand, as shown in FIGS. 10B and 10C, when the load track 20 is not moved, the radial displacement amount of the pocket 12 is large.

When the bottom surface 23*a* of the storage section 23 of the load track 20 is raised with respect to the side surface 12*a* of the pocket 12, there is a possibility that the electronic component W is caught on an edge of the bottom surface 23*a* of the storage section 23 and is thus damaged, or that the electronic component W comes into contact with an upper end of the pocket 12 and is thus damaged (see FIG. 10B).

Alternatively, the step G between the bottom surface 23*a* of the storage section 23 of the load track 20 and the side surface 12*a* of the pocket 12 increases, whereby the electronic component W in the storage section 23 is difficult to smoothly enter the pocket 12 (see FIG. 10C).

On the other hand, according to this embodiment, the step G between the bottom surface 23*a* of the storage section 23 of the load track 20 and the side surface 12*a* of the pocket 12 can be reduced as much as possible, so that the electronic component W in the storage section 23 can be smoothly inserted into the pocket 12 in the index table 11.

The electronic component W inserted from the load track 20 into the pocket 12 in the index table 11 is transferred to the electronic component test apparatus 30A by intermittent rotation of the index table 11.

In this embodiment, the index table 11 is intermittently rotated in 100 equal sections. Namely, the index table 11 is each time rotated at 3.6° and then is stopped (1 step). This operation is repeated sequentially.

After the index table 11 has been operated 50 steps, the electronic components W in the index table 11 reach within an area (area of about 180°) of the electronic component test apparatus 30A, and the intermittent rotation of the index table 11 is stopped. At this time, the probes 30 of the electronic component test apparatus 30A electrically test all the electronic components W within the area (area of about 180°) of the electronic component test apparatus 30A while applying a thermal load thereto at once.

The probes 30 of the electronic component test apparatus 30A may simultaneously apply firstly a thermal load and an electric load to the electronic components W to cause an electronic component W of low reliability, to fail, and then probes 30 may electrically test the electronic components W while applying a thermal load thereto.

Then, the electronic components W in the pockets 12 in the index table 11 are transferred to the electronic component discharge unit 50 along with the intermittent rotation of the index table 11. At this time, the electronic components W in the pockets 12 in the index table 11 are heated to have a high temperature. The electronic components W which have been electrically tested while a thermal load being applied thereto by the probes 30 are discharged outside from the electronic component discharge unit 50.

Specifically, the electronic components W are sorted by the electronic component discharge unit 50 based on the results of the electric test by the probes 30, and are sent from the discharge path 51 to a predetermined collection apparatus 1.

In this case, the results of the electric test by the probes 30 are transmitted from the electric circuit 30*a* to the control unit 40. Based on the electric test results, the control unit 40 controls the electronic component discharge unit 50 such that a not-shown air jet mechanism jets air to send the electronic components W in the pockets 12 in the index table 11 to a predetermined collection apparatus 1 through the discharge path 51. In this embodiment, a plurality of collection apparatuses 1, e.g., six collection apparatuses 1 are installed for each of sort types of the electronic components W to be sorted based on the results of the electric tests by the probes 30.

The electronic components W in the pockets 12 in the index table 11 are sorted by the electronic component discharge unit 50, and are respectively sent to predetermined collection apparatuses through the discharge path 51.

As described above, according to the present embodiment, even when the index table 11 is radially displaced by a maximum of 50 μm because of center deflection, for example, the index table 11 is rotated step by step by the arrangement pitch of the pockets 12 (e.g., 3.6°). Per step, the load track drive unit 27 radially moves the load track 20 by a maximum of 1 μm, for example. This allows the aforementioned maximum radial displacement of, e.g., 50 μm caused by the center deflection to be substantially absorbed by the maximum moving amount 1 μm×50=50 μm (Equation 1) of the load track 20.

Herein, Equation 1 is an equation based on the assumption that the maximum radial displacement of, e.g., 50 μm due to the center deflection of the index table 11 is caused by a half rotation (180°) of the index table 11.

This can reduce as much as the step G between the bottom surface 23*a* of the storage section 23 of the load track 20 and the side surface 12*a*. For example, the step G can be reduced down to 10 μm or less. Thus, even when the curved portion W1 of the electronic component W is, for example, R=20 μm, the electronic components W in the storage section 23 can be smoothly inserted into the pockets 12 in the index table 11, whereby a filling ratio of the electronic components W to the pockets 12 can be raised to nearly 100%.

Second Embodiment

Figure 13:
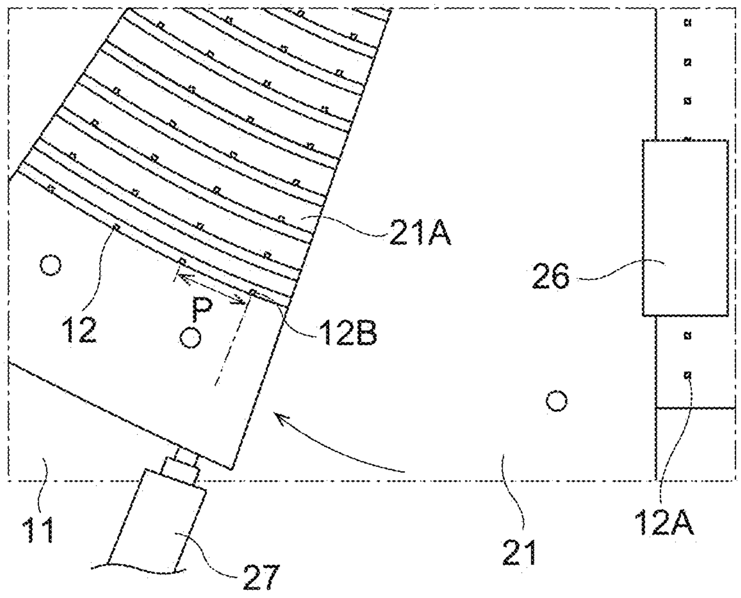
FIG. 13 is a detailed view of the load track in a second embodiment of the electronic component transfer system.

Next, FIG. 13 is a view showing a second embodiment of an electronic component transfer system.

The electronic component transfer system shown in FIG. 13 differs from the first embodiment shown in FIGS. 1 to 12 in the locations of the position detection sensor 26 and the load track drive unit 27. In the electronic component transfer system 10 shown in FIG. 13, while the electronic components W are supplied and stored in the respective pockets 12 in the index table 11, a radial position of each pocket 12 is detected by the position detection sensor 26, and the load track 20 is radially moved by the load track drive unit 27 based on the radial position of each pocket 12.

In the second embodiment shown in FIG. 13, the same symbols are given to the same parts as in the first embodiment shown in FIGS. 1 to 12, and detailed description is omitted.

As shown in FIG. 13, a glass window 21A is attached to the surface of the load track body 21 of the load track 20. Positions of the pockets 12 in the index table 11 can be visually confirmed through the glass window 21A.

The position detection sensor 26 that detects radial positions of the pockets 12 in the index table 11 is provided on the right outside of the load track 21 of the load track 20. Namely, in FIG. 13, the position detection sensor 26 is arranged circumferentially outside the load track body 21 and is fixed on the inclined surface 10*a* of the structure 10A.

The load track body 21 of the load track 20 is movable along the radial direction of the index table 11. The load track drive unit 27 that radially moves the load track body 21 is provided on an outer periphery of the load track body 21.

The load track drive unit 27 moves the load track body 21 along the radial direction of the index table 11 to adjust a radial position of the pocket 12 in the index table 11 with respect to the load track body 21 of the load track 20. Since the radial position of the pocket 12 in the index table 11 with respect to the load track body 21 of the load track 20 is adjusted to reduce as much as possible the step G between the bottom surface 23*a* of the storage section 23 of the load track 20 and the side surface 12*a*, the electronic component W in the storage section 23 can be smoothly inserted into the pocket 12 (see FIG. 11).

In this embodiment, the aforementioned position detection sensor 26 and the load track drive unit 27 are provided, and a signal from the position detection sensor 26 is transmitted to the control unit 40. The control unit 40 controls the load track drive unit 27 to radially move the load track body 21 of the load track 20, based on a position from the position detection sensor 26.

This allows the pockets 12 in the index table 11 to be radially moved with respect to the load track 20. Thus, even when a gap G is formed between the bottom surface 23*a* of the storage section 23 of the load track 20 and the side surface 12*a*, the the step G between the bottom surface 23*a* of the storage section 23 of the load track 20 and the side surface 12*a* can be reduced as much as down to, for example, 10 μm or less, by moving the load track body 21 by the load track drive unit 27 along the radial direction of the index table 11.

This allows the electronic components W in the storage section 23 to be smoothly inserted into the pockets 12 in the index table 11

In this embodiment, the load track drive unit 27 is arranged on a radial extension line of the right peripheral part of the glass window 21A. However, not limited thereto, the load track drive unit 27 may be arranged at circumferentially a center position of the load track body 21, instead of being arranged on a radial extension line of the right peripheral part of the glass window 21A.

Also in this embodiment, a suction hole 10*b* is formed in the inclined surface 10*a* of the structure 10A, for suctioning an electronic component W stored in the storage section 23 of the load track 20 into the pocket 12 in the index table 11 (see FIGS. 10A to 10C).

Next, specific operations of the position detection sensor 26 are described using the flowchart shown in FIG. 4.

In this case, the electronic component transfer system 10 having the following specific characteristics is described by way The index table 11 of the electronic component transfer system 10 has a diameter of 300 mm and a thickness of 0.9 mm.

The pockets 12 in the index table 11 are intended for 1005 electronic components W. Each pocket 12 has a square shape with 0.7 mm on each side, when the index table 11 is seen from a normal direction.

The pockets 12 provided in the index table 11 are circumferentially arranged in sixteen lines. The pockets 12 in each line are arranged at 100 equal divisions of 360° around the index table 11.

The index table 11 is assumed to be radially displaced by a maximum of 50 μm because of center deflection.

Further, in this embodiment, the control unit 40 drives and controls the load track drive unit 27 in such a manner that the radial displacement of the pocket with respect to the load track body 21 of the load track 20 becomes less than 10 μm.

Detection accuracy of the position detection senor 26 is 1 μm or less. The load track drive unit 27 has a drive element including a drive motor and a transmission mechanism. Movement accuracy of the load track drive unit 27 is 1 μm or less.

Next, on the assumption that the electronic component transfer system 10 according to the present disclosure has the above characteristics, an operation of the present embodiment is described below.

As shown in FIG. 4, a pocket 12B at a visual inspection position of the index table 11 is visually confirmed previously. Based on an initial radial position of the pocket 12B, the control unit 40 drives the load track drive unit 27 (see FIG. 13).

In this manner, the initial radial position of the pocket 12 is adjusted with respect to the load track body 21 of the load track 20, so that the initial radial position of the pocket 12 is set with respect to the load track body 21 (FIG. 13).

In this embodiment, the initial radial position of the pocket 12B at the visual position is set.

As shown in FIG. 13, the pocket 12B at the visual position and the load track drive unit 27 are arranged side by side in the same radial direction of the index table 11. As described below, the pocket 12B at the detection position and the position detection sensor 26 are also arranged side by side in the same radial direction of the index table. The pocket 12A at the detection position and the pocket 12B at the visual position are circumferentially separated by 6 steps.

Then, electronic components W such as capacitors in the electronic component supply unit 15 are supplied to the desired storage section 23 of the load track 20 and are stored in the storage section 23.

During this process, the index table 11 is rotated clockwise, so that the electronic components W stored in the storage section 23 are inserted in the respective pockets 12 in the index table 11. In this case, since the inclined surface 10*a* positioned on the back side of the index table 11 is provided with the suction hole 10*b*, the electronic component W in the storage section 23 is suctioned by the suction hole 10*b* of the inclined surface 10*a* so as to be stored in each pocket 12 in the index table 11.

When the electronic components W are supplied from the electronic component supply unit 15 to the respective storage sections 23, the electronic components W are put into the storage section 23 from its upper part through the opening 15*a* of the electronic component supply unit 15, and the electronic components W put into the storage section 23 fall by gravity and are stored in a lower part of each storage section 23.

While the electronic components W are put into each storage section 23 from the electronic component supply unit 15, the index table 11 is intermittently rotated clockwise. This causes the electronic components W in each storage section 23 to be stored in a mass around a position of 15 degrees downstream of the lower end 11A of the index table 11, by frictional force with the index table 11. The number of electronic components W stored in a mass in each storage section 23 becomes maximum around the position of 15 degrees downstream of the lower end 11. The number of electronic components W gradually decreases to a position of 45° toward the downstream side, and similarly gradually decreases to the upstream side of the index table 11 up to the lower end 11A.

Thus, the number of electronic components W in each storage section 23 forms a chevron around the position of 15 degrees downstream of the lower end 11A. The electronic components W are present up to the position of 45° toward the downstream side with the number thereof gradually decreasing, and are similarly present to the upstream side up to the lower end 11A with the number thereof gradually decreasing.

According to this embodiment, the number of electronic components W in each storage section 23 forms a chevron around the position of 15 degrees downstream of the lower end 11A, and the electronic components W are distributed from the position of 45 degrees downstream of the lower end 11A up to the lower end 11A. Thus, the electronic components W are stored in the pockets 12 in the index table 11 within a range from the position of 45 degrees downstream of the lower end 11A up to the lower end 11A.

In this embodiment, the load track 20 is provided with the electronic component detection unit 25 within a range α2 of 10 degrees to 20 degrees downstream of the lower end 11A, preferably at a position of 15 degrees downstream of the lower end 11A. Thus, the electronic component detection unit 25 can detect whether the electronic component W is stored in the pocket 12 at a set position of the electronic component detection unit 25.

Since the electronic component detection unit 25 detects the presence of the electronic component W in the pocket 12, appropriate quantities of electronic components W can be supplied into the load track 20, and the electronic components W can be reliably supplied into the pockets 12.

During this process, a laser beam is projected from the laser beam projector 26*a* of the position detection sensor 26 to the pocket 12A at the detection position (see FIG. 12). The laser beam from the laser beam projector 26*a* is reflected by the side surface 12*a* of the pocket 12A, which is located radially outward, and is received by a laser beam receptor 26*b* of the position detection sensor 26, so that a position of the side surface 12*a* of the pocket 12A, which is located radially outward, is detected. The radial position of the pocket 12A at the detection position is detected by the position detection sensor 26 in this manner. As described above, the pocket 12A at the detection position and the position detection sensor 26 are arranged side by side in the same radial direction of the index table 11. The pocket 12A at the detection position is positioned upstream of the pocket 12B at the visual position by 6 steps.

The pocket 12A at the detection position and the pocket 12B at the visual position are arranged in the outermost line in the radial direction of the index table 11. Since the pocket 12A at the detection position and the pocket 12B at the visual position are arranged in the outermost line in the radial direction of the index table 11, displacement of the pocket 12, which is largely displaced by center deflection of the index table 11, can be reliably detected, so that radial displacement of the pocket 12 with respect to the load track 20 can be accurately detected. In addition, the initial radial position of the pocket 12 with respect to the load track body 21 of the load track 20 can be reliably adjusted. A detection signal from the position detection sensor 26 is transmitted to the control unit 40.

Then, the index table 11 is rotated one step about the rotation shaft 11*a* by a circumferential arrangement pitch P between the pockets 12, and the index table 11 stops thereafter (see FIG. 3).

Then, the radial position of the pocket 12A which has then arrived at the detection position is detected by the position detection sensor 26 similarly to the above.

Then, the radial position of the pocket 12A at the detection position, which has been detected by the position detection sensor 26, is transmitted to the control unit 40.

The control unit 40 determines a radial displacement amount of the pocket 12A per step of the index table 11, based on the radial position of the pocket 12A at the current detection position, and the radial position of the pocket 12A at the detection position which is one step prior to the current detection position.

Then, the control unit 40 controls the load track drive unit 27 to radially move the load track body 21 of the load track 20, based on the radial displacement amount of the pocket 12A per step of the index table 11.

In this case, the control unit 40 may determine a backlash compensation value for the drive element including the drive motor and the transmission mechanism. At this time, the control unit 40 can determine a value obtained by adding the backlash compensation value of the drive element to the radial displacement amount of the pocket 12A per step of the index table 11, and can control based on the value the load tack drive unit 27 to radially move the load track body 21 of the load track 20 by the load track drive unit 27.

Since the control unit 40 drives and controls the load track dive unit 27 in consideration of the backlash compensation value of the drive element of the load track drive unit 27, the load track body 21 of the load track 20 can be driven by an accurate movement amount.

Next, an effect of radially moving the load track body of the load track 20 by the load track drive unit 27 is described with reference to FIGS. 10A to 10C.

According to this embodiment, the control unit 40 controls the load track drive unit 27 based on a radial displacement amount of the pocket 12A at the detection position of the index table 11 to radially move the load track body 21 of the load track 20 such that the radial displacement amount decreases. Thus, as shown in FIG. 10A, the step G between the bottom surface 23*a* of the storage section 23 of the load track 20 and the side surface 12*a* of the pocket 12 can be reduced as much as possible. For example, the step G can be reduced down to 10 μm or less. This allows the electronic components W in the storage section 23 to be smoothly inserted into the pockets 12 in the index table 11, whereby a filling ratio of the electronic components W to the pockets 12 can be raised to nearly 100% (see FIGS. 10A and 11).

On the other hand, as shown in FIGS. 10B and 10C, when the load track 20 is not moved, the radial displacement amount of the pocket 12 is large.

When the bottom surface 23*a* of the storage section 23 of the load track 20 is raised with respect to the side surface 12*a* of the pocket 12, there is a possibility that the electronic component W is caught on an edge of the bottom surface 23*a* of the storage section 23 and is thus damaged, or that the electronic component W comes into contact with an upper end of the pocket 12 and is thus damaged (see FIG. 10B).

Alternatively, the step G between the bottom surface 23*a* of the storage section 23 of the load track 20 and the side surface 12*a* of the pocket 12 increases, whereby the electronic component W in the storage section 23 is difficult to smoothly enter the pocket 12 (see FIG. 10C).

On the other hand, according to this embodiment, the step G between the bottom surface 23*a* of the storage section 23 of the load track 20 and the side surface 12*a* of the pocket 12 can be reduced as much as possible, so that the electronic component W in the storage section 23 can be smoothly inserted into the pocket 12 in the index table 11.

This can reduce as much as the step G between the bottom surface 23*a* of the storage section 23 of the load track 20 and the side surface 12*a*. For example, the step G can be reduced down to 10 μm or less. Thus, even when the curved portion W1 of the electronic component W is, for example, R=20 μm, the electronic components W in the storage section 23 can be smoothly inserted into the pockets 12 in the index table 11, whereby a filling ratio of the electronic components W to the pockets 12 can be raised to nearly 100%.

Further, since the position detection sensor 26 is provided on the index table 11 on the right outside of the load track body 21 of the load track 20, the position detection sensor 26 can be installed without overlapping with the load track body 21. This can facilitate installation work of the position detection senor 26. Furthermore, the position detection sensor 26 can directly detect the pocket 12A at the detection position without through the glass window 21A.

The pocket 12A at the detection position and the pocket 12B at the visual position are circumferentially separated by 6 steps. On the assumption that detection error per step by the position detection sensor 26 is 1 μm or less, the maximum detection error after 6 steps is 6 μm. However, since this is sufficiently smaller than the objective step G of 10 μm, there is no practical problem at all. According to the present embodiment, the position detection sensor 26 is provided outside the load track body 21 of the load track 20. Since no electronic component W is present in the pocket 12 positioned outside the load track body 21, while the electronic components W are supplied and stored in the pockets 12 within the area of the load track body 21, i.e., while the electronic component transfer system 10 is actually operated, the radial positions of the pockets 12 can be accurately and reliably detected by the position detection sensor 26, so that the load track 20 can be radially moved to adjust the radial positions of the pockets 12 with respect to the load track 20.

In this embodiment, an example in which the pocket 12A at the detection position and the pocket 12B at the visual position are circumferentially separated by 6 steps is described, but the separation range may be between 1 and 10 steps. Namely, the separation range may be in the range of (360°/100)×1 to 10 steps, i.e., 3.6° to 36°.

1 Collection apparatus
10 Electronic component transfer system
10A Structure
10*a* Inclined surface
11 Index table
11*a* Rotation shaft
12 Pocket
12A Pocket at detection position
12B Pocket at visual position
12*a* Side surface
15 Electronic component supply unit
18 Supply feeder
19 Supply amount detection sensor
20 Load track
21 Load track body
21A Glass window
22 Wall surface
23 Storage section
23*a* Bottom surface
25 Electronic component detection unit
26 Position detection sensor
27 Load track drive unit
30 Probe
30A Electronic component test apparatus
30*a* Electric circuit
31 Probe holder
32*a*, 32*b*, 32*c* Probe holder body
33*a*, 33*b* Sheet member
35 Probe heater
36 Electrode
36A Electrode unit
37 Electrode holder
38 Probe heater
40 Control unit
50 Electronic component discharge unit
51 Discharge path
W Electronic component
G Step
P Arrangement pitch

The invention claimed is:

1. An electronic component transfer system comprising:

a discoid index table having a plurality of circumferentially arranged pockets each for storing an electronic component, the index table being intermittently rotated step by step by an arrangement pitch of the pockets;

a load track provided on the index table, and having storage sections corresponding to the pockets and storing the electronic components;

a position detection sensor provided on the index table to detect a radial position of the pocket at a detection position;

a load track drive unit that radially moves the load track; and a control unit;

wherein the control unit drives the load track drive unit to radially move the load track per step of the index table to adjust the radial position of the pocket with respect to the load track, based on a signal from the position detection sensor.

2. The electronic component transfer system according to claim 1, further comprising an electronic component test apparatus provided on the index table to electrically test the electronic components.

3. The electronic component transfer system according to claim 1, wherein:

the control unit drives the load track dive unit to radially move the load track to adjust the radial position of the pocket with respect to the load track, based on a signal from the position detection sensor, with no electronic component being stored in the pockets in the index table over all the circumference of the index table; and the control unit drives the load track drive unit to radially move the load track by the same movement amount as a radial movement amount at the same circumferential position when no electronic component is stored in the pockets in the index table, to adjust a radial position of the pocket with respect to the load track, with electronic components being stored in the pockets in the index table.

4. The electronic component transfer system according to claim 1, wherein the control unit determines a radial displacement amount of the pocket per step of the index table based on a radial position of the pocket at the current detection position and a radial position of the pocket at the detection position which is one step prior to the current detection position, and drives the load track drive unit per step of the index table based on the radial displacement amount of the pocket to adjust a radial position of the pocket with respect to the load track.

5. The electronic component transfer system according to claim 1, wherein the control unit previously drives the load track drive unit based on an initial radial position of the pocket at a visual position with respect to the load track to adjust the initial radial position of the pocket with respect to the load track.

6. The electronic component transfer system according to claim 5, wherein the visual position of the pocket and the detection position of the pocket are the same.

7. The electronic component transfer system according to claim 5, wherein the visual position of the pocket and the detection position of the pocket are circumferentially separated by between at 3.6° or more and 36° or less.

8. The electronic component transfer system according to claim 2, wherein:

the control unit drives the load track dive unit to radially move the load track to adjust the radial position of the pocket with respect to the load track, based on a signal from the position detection sensor, with no electronic component being stored in the pockets in the index table over all the circumference of the index table; and the control unit drives the load track drive unit to radially move the load track by the same movement amount as a radial movement amount at the same circumferential position when no electronic component is stored in the pockets in the index table, to adjust a radial position of the pocket with respect to the load track, with electronic components being stored in the pockets in the index table.

* * * * *